(12) United States Patent
Liu et al.

(10) Patent No.: US 10,896,921 B2
(45) Date of Patent: Jan. 19, 2021

(54) MANUFACTURING METHOD OF ARRAY SUBSTRATE

(71) Applicant: Wuhan China Star Optoelectronics Technology Co., Ltd., Wuhan (CN)

(72) Inventors: Guanghui Liu, Wuhan (CN); Xin Zhang, Wuhan (CN); Yuan Yan, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/086,041

(22) PCT Filed: Aug. 1, 2018

(86) PCT No.: PCT/CN2018/098025
§ 371 (c)(1),
(2) Date: Sep. 18, 2018

(87) PCT Pub. No.: WO2019/205333
PCT Pub. Date: Oct. 31, 2019

(65) Prior Publication Data
US 2019/0333945 A1 Oct. 31, 2019

(51) Int. Cl.
*H01L 27/12* (2006.01)
*G02F 1/1343* (2006.01)
(Continued)

(52) U.S. Cl.
CPC ...... *H01L 27/1288* (2013.01); *G02F 1/13338* (2013.01); *G02F 1/13439* (2013.01); *G02F 1/133345* (2013.01); *H01L 27/124* (2013.01); *H01L 27/1222* (2013.01); *H01L 27/1248* (2013.01); *H01L 29/66757* (2013.01);
(Continued)

(58) Field of Classification Search
CPC ......... H01L 29/66757; H01L 29/78675; H01L 29/78633; H01L 27/1288; H01L 27/124; H01L 27/1222; H01L 27/1248; G02F 1/13439; G02F 1/133345; G02F 1/13338;
(Continued)

(56) References Cited

U.S. PATENT DOCUMENTS

2015/0303222 A1 10/2015 Ning
2018/0226458 A1* 8/2018 Bai ..................... H01L 27/3276

FOREIGN PATENT DOCUMENTS

CN 103646966 3/2014
CN 104078423 10/2014
(Continued)

OTHER PUBLICATIONS

English machine translation of CN 104915052A (Year: 2015).*

*Primary Examiner* — Laura M Menz
*Assistant Examiner* — Candice Chan

(57) ABSTRACT

A manufacturing method of a display panel is provided and includes providing a substrate; and forming a buffer layer, a polysilicon layer, a gate electrode, an interlayer insulating layer, a first transparent electrode layer, a source electrode and drain electrode line, and a touch control line on the substrate in sequence. A masking process is omitted using a planarization layer as a photoresist layer of the interlayer insulating layer. One more masking process is omitted by forming the pixel electrode, the source electrode and drain electrode line and the touch control line in a same masking process.

10 Claims, 9 Drawing Sheets

(51) Int. Cl.
*H01L 29/786* (2006.01)
*H01L 29/66* (2006.01)
*G02F 1/1333* (2006.01)
*G06F 3/041* (2006.01)

(52) U.S. Cl.
CPC .. H01L 29/78633 (2013.01); H01L 29/78675 (2013.01); *G02F 2001/133357* (2013.01); *G02F 2201/121* (2013.01); *G02F 2201/123* (2013.01); *G02F 2202/104* (2013.01); *G06F 3/041* (2013.01); *G06F 2203/04103* (2013.01)

(58) Field of Classification Search
CPC ..... G02F 1/136227; G02F 2203/04103; G02F 2001/136231
See application file for complete search history.

(56) References Cited

FOREIGN PATENT DOCUMENTS

| | | | |
|---|---|---|---|
| CN | 104915052 A | * | 2/2015 |
| CN | 106876330 | | 6/2017 |
| CN | 207051870 | | 2/2018 |

* cited by examiner

MANUFACTURING METHOD OF ARRAY SUBSTRATE

RELATED APPLICATIONS

This application is a National Phase of PCT Patent Application No. PCT/CN2018/098025 having International filing date of Aug. 1, 2018, which claims the benefit of priority of Chinese Patent Application No. 2018/10402934.6 filed on Apr. 28, 2018. The contents of the above applications are all incorporated by reference as if fully set forth herein in their entirety.

FIELD AND BACKGROUND OF INVENTION

The invention relates to the field of display technologies, and particular to an array substrate and a manufacturing method thereof.

Because flat display devices, such as liquid crystal displays (abbreviated as LCDs), possess advantages of excellent image quality, power savings, thin frames, wide application range, etc., flat display devices are widely used in consumer electronic products of mobile phones, televisions, personal digital assistants, digital cameras, notebook computers, desktop computers, etc. Flat display devices have become mainstream display devices.

Low-temperature polysilicon (abbreviated as LTPS) display technology in LCDs has relatively high carrier mobility, so that transistors inside the LCDs can have a higher on/off current ratio. Under required charging current conditions, by minimizing thin film transistor size of each pixel and increasing the amount of light transmitting areas in every pixel, aperture ratio of the panel is increased, brightness of the panel is enhanced, the brightness and high-resolution ratio of the panel are improved, and power usage of the panel is reduced, and light transmitting area of each pixel is increased. Therefore, a better visual experience is obtained.

Considering that active matrix of the low-temperature polysilicon technology is developing towards the direction of ever-shrinking size, manufacturing equipment cost has rapidly increased because of sequential improvements in photoetching technology. General in-cell touch structures (in cell touch) is by introducing film layers having touch control function into the processes of arrays of normal displays. In order to achieve the simultaneous functions of both display and touch control, each layer is required to complete masking and etching to form a certain pattern. In-cell touch-control array substrates require twelve steps of photomask processes to prepare, and thus, increasing the use of the exposure machine during the processes of arrays. Therefore, complexity of the processes of arrays is increased and overall productivities of the array substrates are reduced. In order to reduce manufacturing cost, a nine-step masking process is developed for the manufacturing of the array substrates by the industry, as shown in FIG. 1 which is a flow chart of the nine-step masking process. However, it is still unable to meet demands for the increasing manufacturing capacity of the array substrates. There is therefore a need of providing an array substrate and a manufacturing process which are capable of reducing manufacturing costs and manufacturing cycle of the array substrates.

SUMMARY OF INVENTION

The invention provides an array substrate and a manufacturing method thereof to solve the problems of the long manufacturing time and high manufacturing cost of the array substrate due to the large number of the required masking processes in the manufacturing process of the existing array substrate.

In order to achieve the foregoing purposes, the technical scheme provided by the disclosure is as follows:

According to an aspect of the present disclosure, a manufacturing method of an array substrate is provided. The manufacturing method of the array substrate comprises:

a step S10 of providing a substrate and forming a buffer layer on the substrate;

a step S20 of forming a polysilicon layer on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer; and forming a gate insulating layer and a gate electrode, wherein the gate electrode is disposed on the gate insulating layer;

a step S30 of forming an interlayer insulating layer on the buffer layer, wherein the interlayer insulating layer covers the buffer layer, the polysilicon layer, the gate insulating layer, and the gate electrode;

a step S40 of forming a planarization layer on the interlayer insulating layer; exposing, etching, and developing the interlayer insulating layer and the planarization layer using a first photomask to define a first through hole and a second through hole, wherein the first through hole and the second through hole pass through the interlayer insulating layer and the gate insulating layer to connect with the polysilicon layer;

a step S50 of forming a transparent electrode layer and a metal layer on the interlayer insulating layer in sequence, and patterning the transparent electrode layer and the metal layer using a second photomask to form a patterned first transparent electrode layer, a source electrode and drain electrode line, and a touch control line; and a step S60 of forming a passivation layer on the source electrode and drain electrode line and the touch control line, forming a patterned second transparent electrode layer on the passivation layer, wherein the touch control line is electrically connected with the second transparent electrode layer.

According to a preferred embodiment of the present disclosure, the step S50 specifically comprises:

a step S501 of depositing the transparent electrode layer and the metal layer on the interlayer insulating layer in sequence, and coating a photoresist layer on the metal layer;

a step S502 of exposing the photoresist layer using a second photomask, and then etching the photoresist layer to obtain a photoresist pattern; etching the transparent electrode layer using a first etching process to obtain a transparent electrode pattern; and etching the metal layer using a second etching process to obtain a first metal pattern, wherein the first metal pattern comprises a target metal pattern and a metal pattern to be removed;

a step S503 of removing photoresist corresponding to a top of the metal pattern to be removed using an ashing process, and removing the metal pattern to be removed using the second etching process; and a step S504 of stripping residual photoresist to form the first transparent electrode layer, the source electrode and drain electrode line, and the touch control line.

According to a preferred embodiment of the present disclosure, the first etching process is dry etching and the second etching process is wet etching.

According to a preferred embodiment of the present disclosure, the target metal pattern comprises the source electrode and drain electrode line and the touch control line.

According to a preferred embodiment of the present disclosure, the step S40 specifically comprises steps of: forming the planarization layer on the interlayer insulating layer; exposing, etching, and developing the interlayer insulating layer and the planarization layer using the first photomask to define the first through hole and the second through hole; and then etching the residual pattern of the planarization layer, wherein the planarization layer is used as the photoresist layer of the interlayer insulating layer, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

According to a preferred embodiment of the present disclosure, the step S40 specifically comprises steps of: forming the planarization layer on the interlayer insulating layer; coating the photoresist layer on the planarization layer; exposing, etching, and developing the interlayer insulating layer and the planarization layer using the first photomask to define the first through hole and the second through hole; and then etching the residual pattern of the photoresist layer, wherein the planarization layer and the interlayer insulating layer share a common masking process, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

According to another aspect of the present disclosure, an array substrate is provided. The array substrate comprises:
 a substrate;
 a buffer layer disposed on the substrate;
 a polysilicon layer disposed on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer;
 a gate insulating layer disposed on the polysilicon layer;
 a gate electrode disposed on the gate insulating layer;
 a patterned first transparent electrode layer and a patterned second electrode layer, wherein a passivation layer is positioned between the first transparent electrode layer and the second transparent electrode layer, the first transparent electrode layer is electrically connected with the source electrode doped area and the drain electrode doped area, a metal layer is disposed on the first transparent electrode layer, a source electrode and drain electrode line and a touch control line are disposed in the metal layer, the source electrode and drain electrode line is electrically connected with the source electrode doped area and the drain electrode doped area, and the touch control line is electrically connected with the second transparent electrode layer.

According to a preferred embodiment of the present disclosure, the array substrate further comprises a planarization layer, and the planarization layer is disposed on the interlayer insulating layer.

According to a preferred embodiment of the present disclosure, the first transparent electrode layer is patterned to form a pixel electrode, and the second transparent electrode layer is patterned to form a common electrode.

According to another aspect of the present disclosure, a manufacturing method of an array substrate is provided. The manufacturing method of the array substrate comprises:
 a step S10 of providing a substrate and forming a buffer layer on the substrate;
 a step S20 of forming a polysilicon layer on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer; and forming a gate insulating layer and a gate electrode, wherein the gate electrode is disposed on the gate insulating layer;
 a step S30 of forming an interlayer insulating layer on the buffer layer, wherein the interlayer insulating layer covers the buffer layer, the polysilicon layer, the gate insulating layer, and the gate electrode;
 a step S40 of forming a planarization layer on the interlayer insulating layer; exposing, etching, and developing the interlayer insulating layer and the planarization layer using a first photomask to define a first through hole and a second through hole, wherein the first through hole and the second through hole pass through the interlayer insulating layer and the gate insulating layer to connect with the polysilicon layer;
 a step S50 of forming a transparent electrode layer and a metal layer on the interlayer insulating layer in sequence, and patterning the transparent electrode layer and the metal layer using a second photomask to form a patterned first transparent electrode layer, a source electrode and drain electrode line, and a touch control line; and
 a step S60 of forming a passivation layer on the source electrode and drain electrode line and the touch control line, forming a patterned second transparent electrode layer on the passivation layer, wherein the touch control line is electrically connected with the second transparent electrode layer;
 wherein the first photomask is a normal mask, the second photomask is a halftone mask, the first transparent electrode layer is patterned to form a pixel electrode, and the second transparent electrode layer is patterned to form a common electrode.

According to a preferred embodiment of the present disclosure, the step S50 specifically comprises:
 a step S501 of depositing the transparent electrode layer and the metal layer on the interlayer insulating layer in sequence, and coating a photoresist layer on the metal layer;
 a step S502 of exposing the photoresist layer using a second photomask, and then etching the photoresist layer to obtain a photoresist pattern; etching the transparent electrode layer using a first etching process to obtain a transparent electrode pattern; and etching the metal layer using a second etching process to obtain a first metal pattern, wherein the first metal pattern comprises a target metal pattern and a metal pattern to be removed;
 a step S503 of removing photoresist corresponding to a top of the metal pattern to be removed using an ashing process, and removing the metal pattern to be removed using the second etching process; and
 a step S504 of stripping residual photoresist to form the first transparent electrode layer, the source electrode and drain electrode line, and the touch control line.

According to a preferred embodiment of the present disclosure, the first etching process is dry etching and the second etching process is wet etching.

According to a preferred embodiment of the present disclosure, the target metal pattern comprises the source electrode and drain electrode line and the touch control line.

According to a preferred embodiment of the present disclosure, the step S40 specifically comprises steps of: forming the planarization layer on the interlayer insulating layer; exposing, etching, and developing the interlayer insulating layer and the planarization layer using the first photomask to define the first through hole and the second through hole; and then etching the residual pattern of the planarization layer, wherein the planarization layer is used as the photoresist layer of the interlayer insulating layer, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

According to a preferred embodiment of the present disclosure, the step S40 specifically comprises steps of: forming the planarization layer on the interlayer insulating layer; coating the photoresist layer on the planarization layer; exposing, etching, and developing the interlayer insulating layer and the planarization layer using the first photomask to define the first through hole and the second through hole; and then etching the residual pattern of the photoresist layer, wherein the planarization layer and the interlayer insulating layer share a common masking process, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

The advantages of the present disclosure are that providing an array substrate and a manufacturing method thereof in which the planarization layer and interlayer insulating layer are prepared by sharing one masking process, and the positions of a pixel electrode and a common electrode are swapped so that a source and drain electrode, a pixel electrode, and a touch control line are prepared by sharing one masking process. There is therefore providing a seven-step masking processes technology for forming an in-cell touch structure and thus, shortening the manufacturing cycle and saving the manufacturing cost.

BRIEF DESCRIPTION OF THE SEVERAL VIEWS OF THE DRAWINGS

In order to illustrate a technical solution in the embodiments or in the prior art more clearly, the accompanying drawings required in the description of the embodiments or the prior art are introduced briefly hereafter. It is obvious that the accompanying drawings in the following description are merely part of the embodiments of the present invention. People with ordinary skills in the art can obtain other drawings without making inventive efforts.

DETAILED DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

The disclosure provides an array substrate and a manufacturing method thereof to solve the problems of the long manufacturing time and high manufacturing cost of the array substrate due to the large number of the required masking processes in the manufacturing process of the existing array substrate.

The present disclosure will be further described in detail with the accompanying drawings and the specific embodiments.

Figure 1:
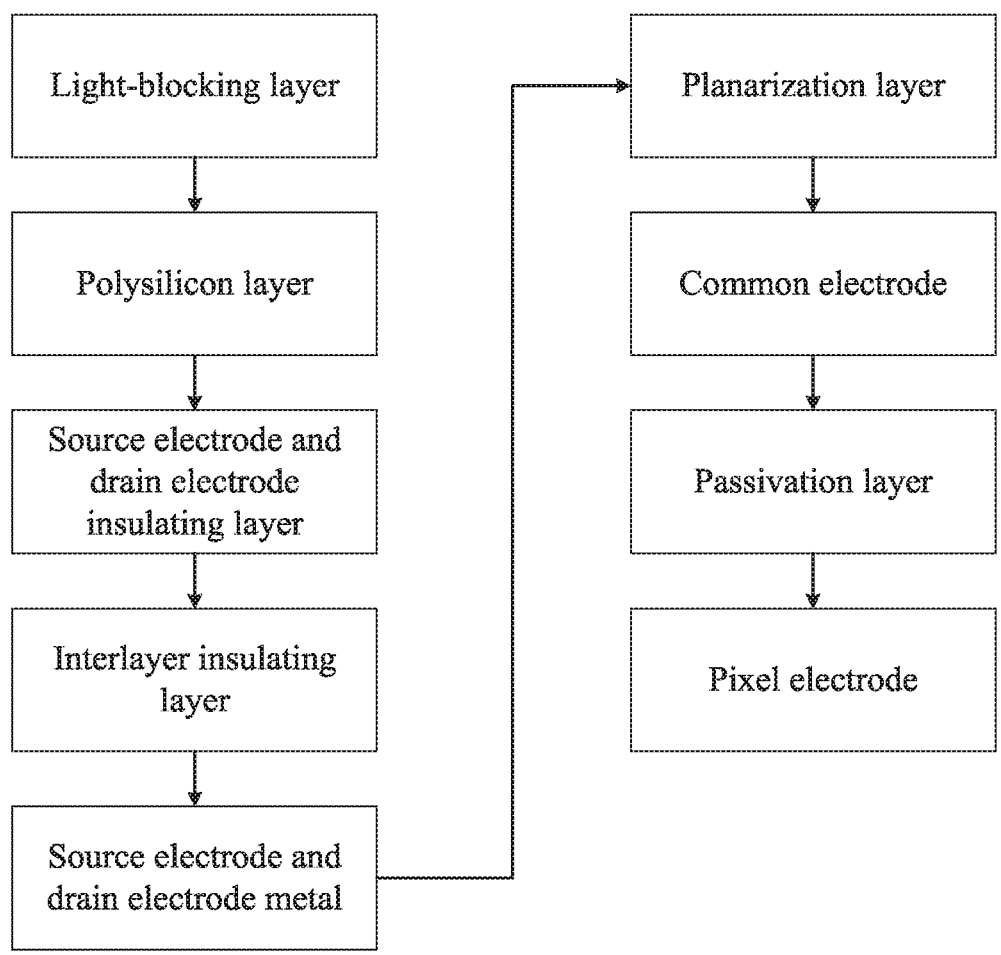
FIG. 1 is a schematic flow diagram of the nine-step masking process in the manufacturing method of an array substrate in the prior art.
Figure 2:
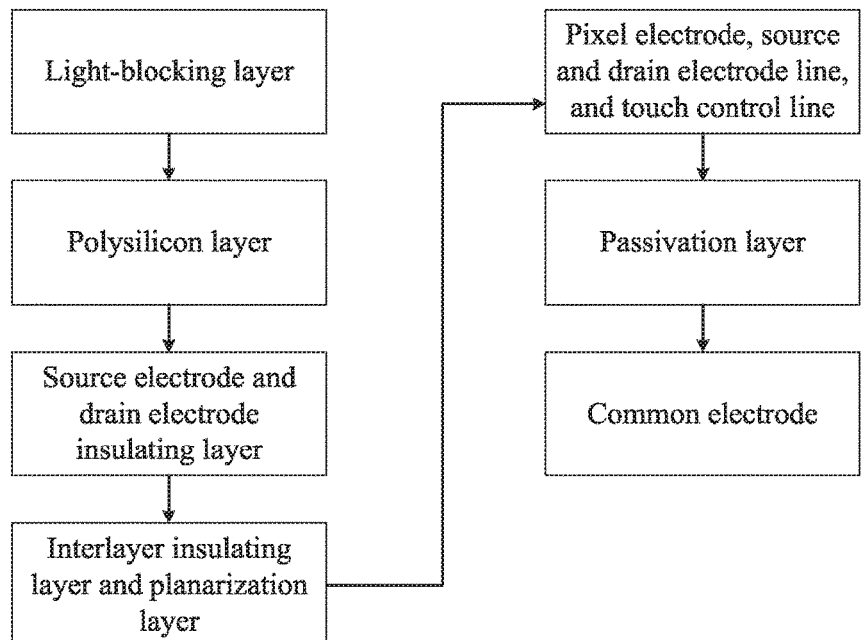
FIG. 2 is a schematic flow diagram of a seven-step masking process in the manufacturing method of an array substrate in an embodiment of the present disclosure.
Figure 3:
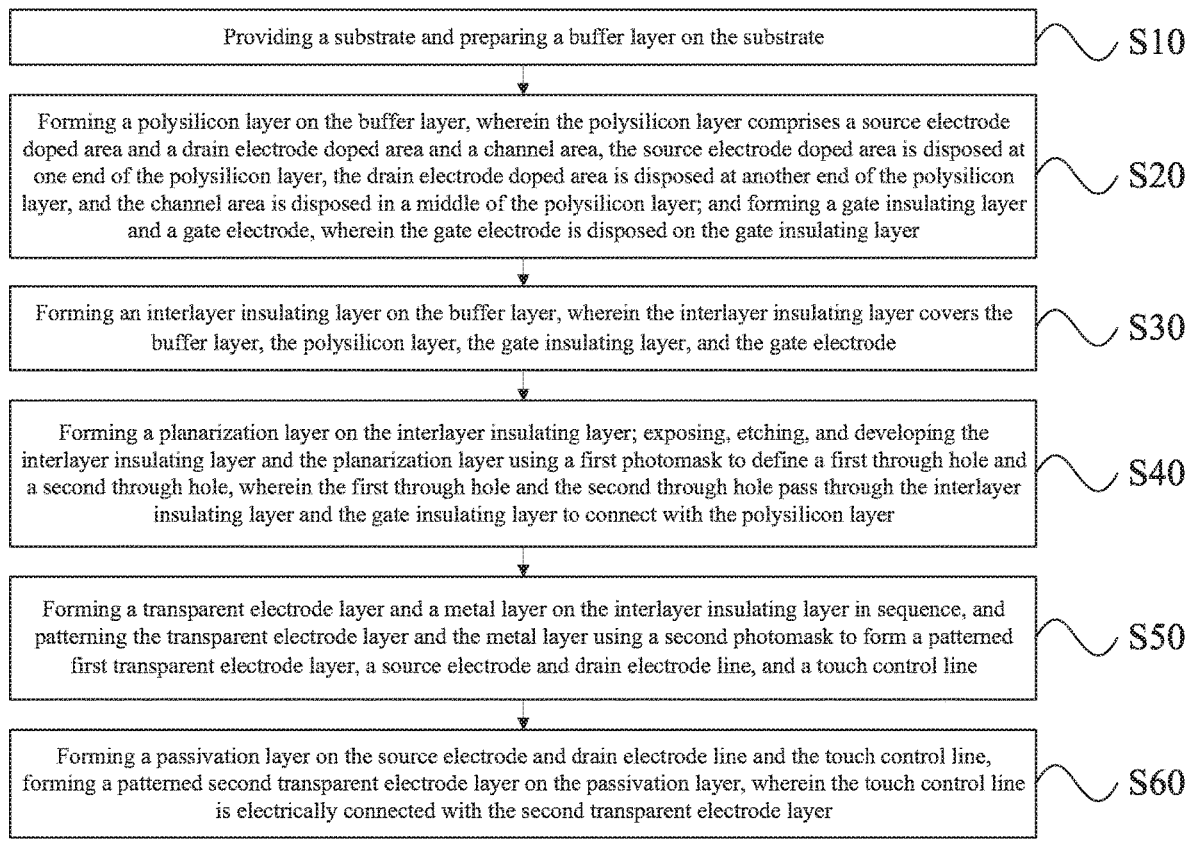
FIG. 3 is a schematic flow diagram of the manufacturing method of an array substrate in an embodiment of the present disclosure.

FIG. 2 is a schematic flow diagram of the seven masking processes in the manufacturing method of an array substrate in an embodiment of the present disclosure. FIG. 3 is a schematic flow diagram of the manufacturing method of an array substrate in an embodiment of the present disclosure. FIGS. 5A-5F are structural schematic views of the manufacturing method of an array substrate in an embodiment of the present disclosure.

Figure 5A:
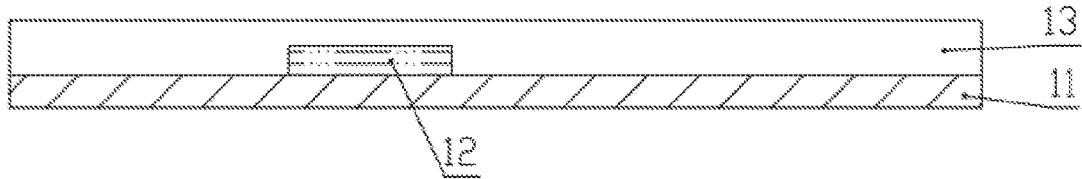
FIGS. 5A-5F are structural schematic views of the manufacturing method of an array substrate in an embodiment of the present disclosure.

As shown in FIGS. 2, 3, and 5A-5F, the present disclosure provides a manufacturing method of an array substrate which is referred to as embodiment I. The manufacturing method of the array substrate comprises, a step S10 of providing a substrate 11 and forming a buffer layer 13 on the substrate, as is shown in FIG. 5A.

In an embodiment, the step S10 further comprises forming a light-shielding layer and the buffer layer 13 covers the light-shielding layer 12.

Specifically, the material of the light-shielding layer 12 is molybdenum (Mo) and the material of the buffer layer is at least one of silicon nitrides and silicon oxides.

Figure 5B:
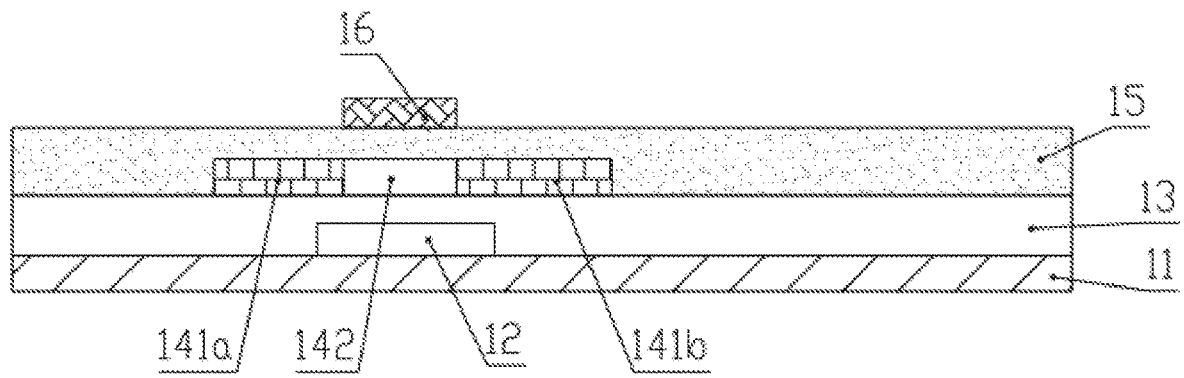

As shown in FIG. 5B, a step S20 of forming a polysilicon layer 14 on the buffer layer 13, wherein the polysilicon layer 14 comprises a source electrode doped area 141a, a drain electrode doped area 141b, and a channel area 142, the source electrode doped area 141a is disposed at one end of the polysilicon layer 14, the drain electrode doped area 141b is disposed at another end of the polysilicon layer 14, and the channel area 142 is disposed in the middle of the polysilicon layer 14; and forming a gate insulating layer 15 and a gate electrode 16 on the polysilicon layer 14, wherein the gate electrode 16 is disposed on the gate insulating layer 15

Specifically, the source electrode doped area 141a comprises a source electrode heavy doped area and a source electrode light doped area. The drain electrode doped area 141b comprises a drain electrode heavy doped area and a drain electrode light doped area.

The manufacturing materials of the gate insulating layer 15 are silicon nitrides and silicon oxides and the manufacturing materials of the gate electrode is molybdenum (Mo).

Figure 5C:
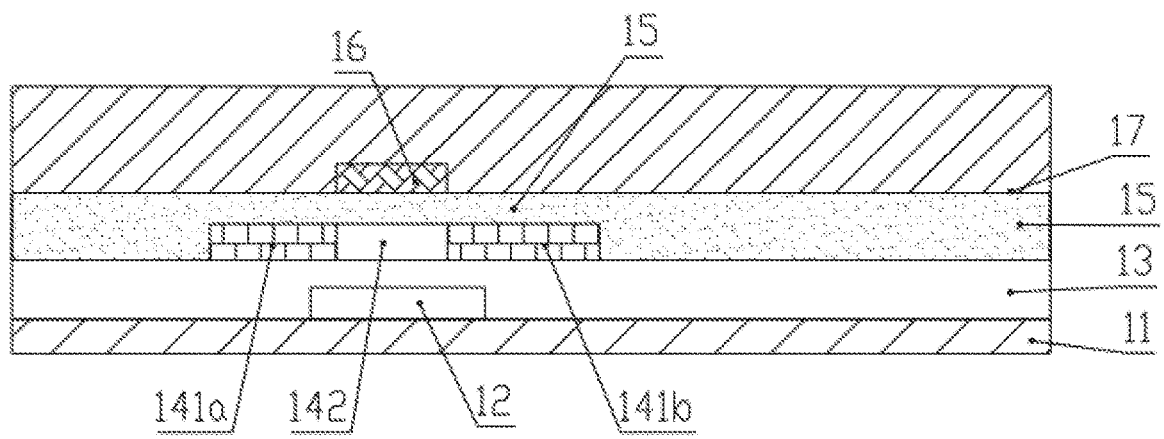

As shown in FIG. 5C, a step S30 of forming an interlayer insulating layer 17 on the buffer layer 13, wherein the interlayer insulating layer 17 covers the buffer layer 13, the polysilicon layer 14, the gate insulating layer 15, and the gate electrode 16.

The manufacturing material of the interlayer insulating layer 17 is at least one of silicon nitrides and silicon oxides.

Figure 5D:
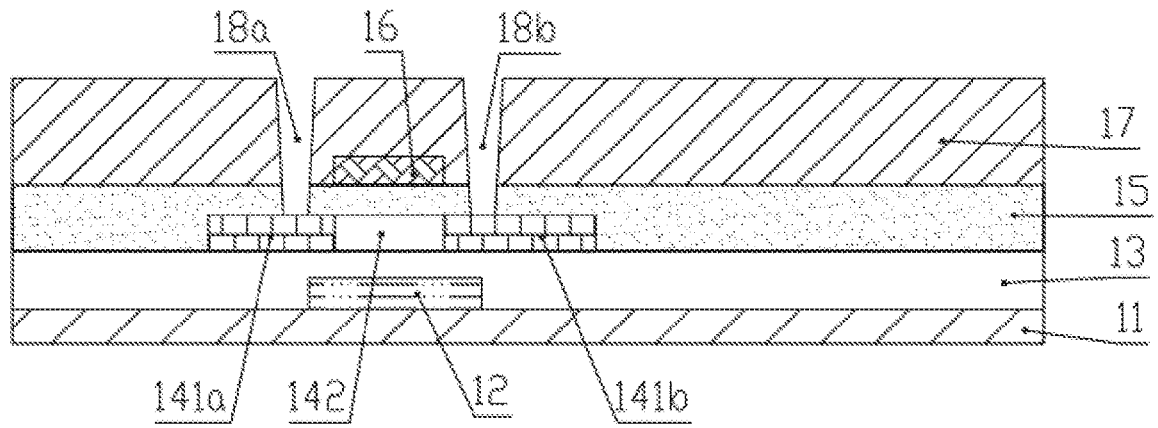

As shown in FIG. 5D, a step S40 of forming a planarization layer (not shown) on the interlayer insulating layer 17, exposing, etching, and developing the interlayer insulating layer 17 and the planarization layer using a first photomask to define a first through hole 18a and a second through hole 18b, wherein the first through hole 18a and the second through hole 18b pass through the interlayer insulating layer 17 and the gate insulating layer 15 to connect with the polysilicon layer 14, wherein the first through hole 18a connects with the source electrode doped area 141a, and the second through hole 18b connects with the drain electrode doped area 141b.

It is appreciated that the first photomask can be a normal mask. The manufacturing of interlayer insulating layer 17 and the planarization layer require two masking processes. However, in the present disclosure, using the planarization layer as a light blocking layer of the interlayer insulating layer 17 and etching the planarization layer after exposing, etching, and developing the interlayer insulating layer 17, the manufacturing of the interlayer insulating layer 17 is accomplished. In the embodiment of the present disclosure, the interlayer insulating layer 17 possesses double functions of insulation and planarization, and thus, omitting a masking process compared with the prior art.

In another embodiment, the planarization layer can be retained. When undergoing the manufacturing processes of the interlayer layer 17 and the planarization layer, because the patterns of the interlayer layer 17 and planarization layer are the same, only one masking process is used in manufacturing. Therefore, a masking process can be omitted compared with the prior art. Because an additional light-blocking layer is required in manufacturing of the present embodiment, the manufacturing method of an array substrate without a planarization layer is mainly described hereafter.

Figure 5E:
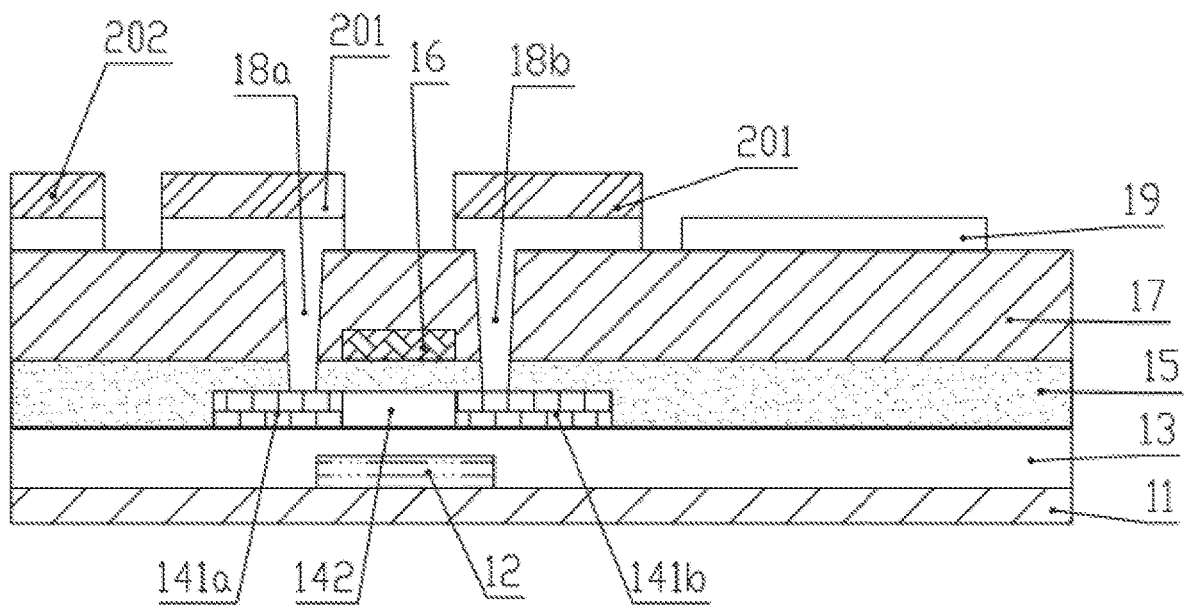

As shown in FIG. 5E, a step S50 of forming a transparent electrode layer 19a and a metal layer 20a on the interlayer insulating layer 17 in sequence, and patterning the transparent electrode layer 19a and the metal layer 20a using a second photomask to form a patterned first transparent electrode layer 19, a source electrode and drain electrode line, and a touch control line 20 (both the source electrode and drain electrode line and the touch control line are designated by the reference numeral 20).

Figure 4:
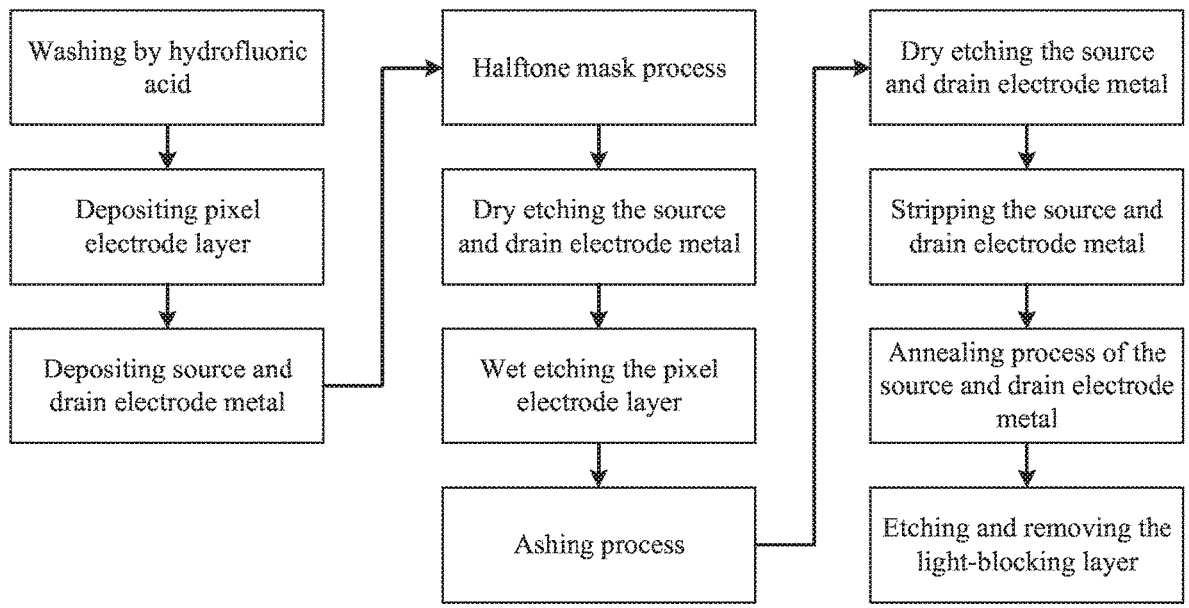
FIG. 4 is a schematic flow diagram of the primary processes of a step S50 of the manufacturing method of an array substrate in an embodiment of the present disclosure

Further, a schematic flow diagram of the main processes of the step S50 is shown in FIG. 4 and a sequential, structural schematic views of the step S50 is shown in FIGS. 6A-6D.

Figure 6A:
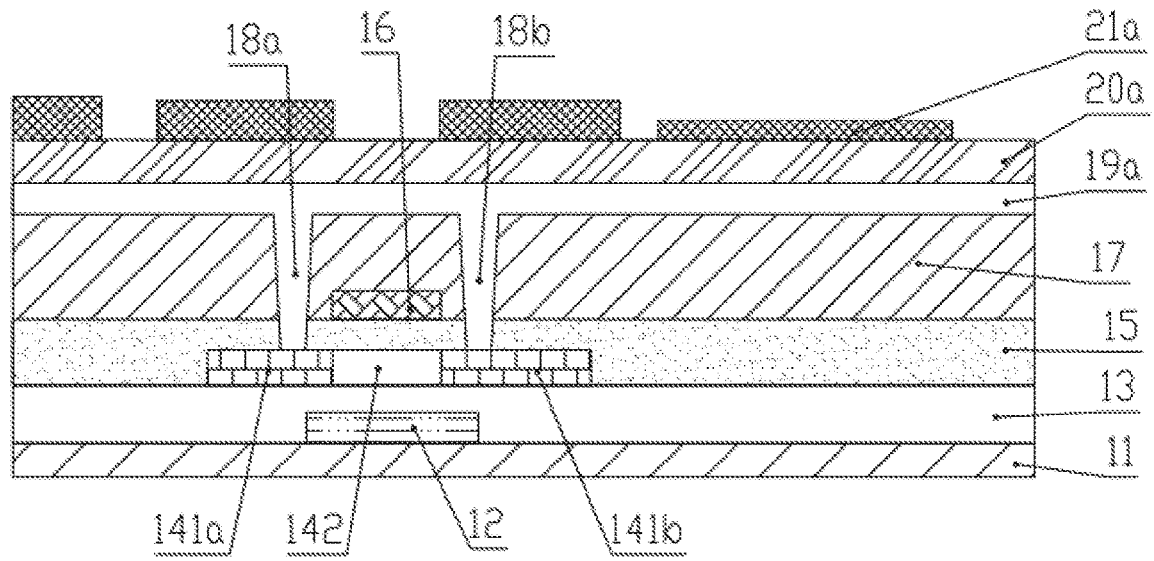
FIGS. 6A-6D are sequential, structural schematic views of a step S50 in an embodiment of the present disclosure.
Figure 6B:
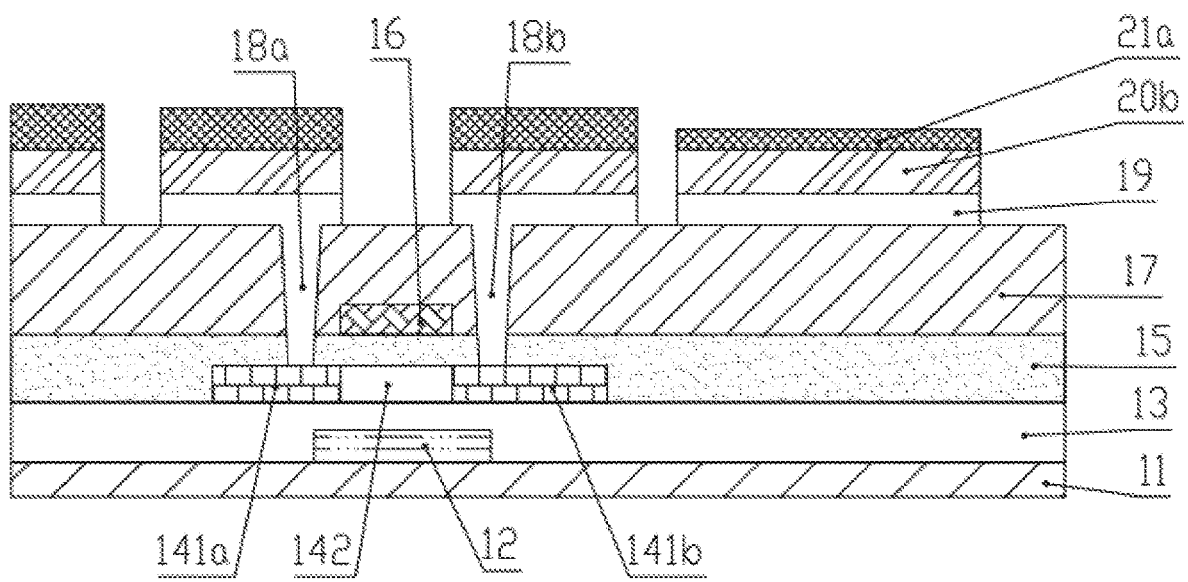
Figure 6C:
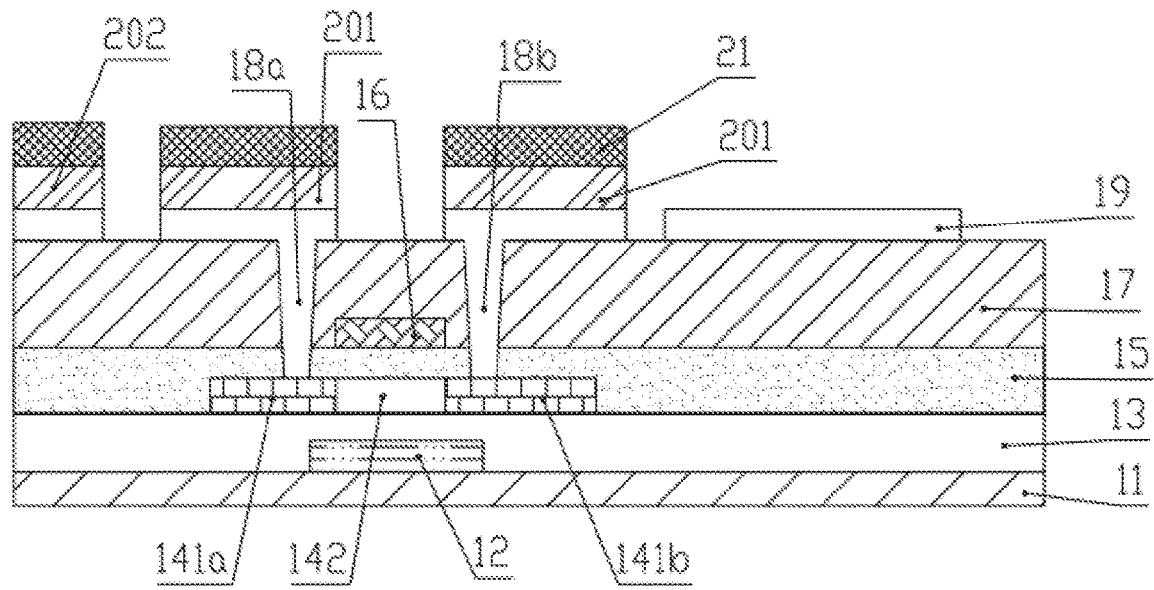
Figure 6D:
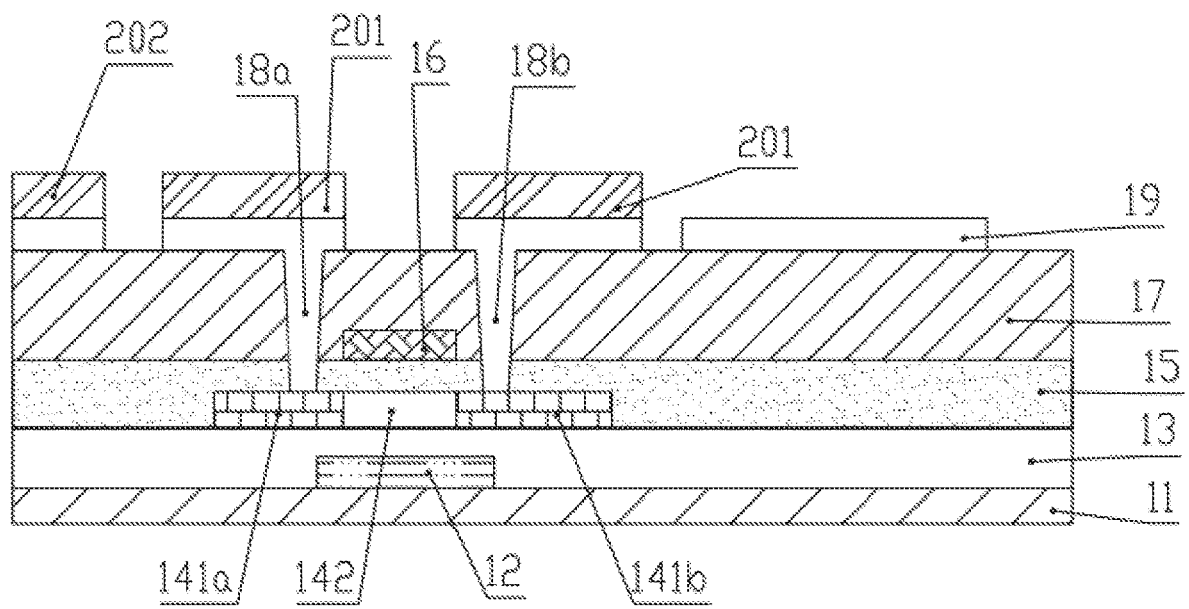

The step S50 specifically comprises,

As shown in FIGS. 6A and 6B, a step S501 of depositing the transparent electrode layer 19a and the metal layer 20a on the interlayer insulating layer in sequence, and coating a photoresist layer on the metal layer 20a;

a step S502 of exposing the photoresist layer using a second photomask, and then etching the photoresist layer to obtain a photoresist pattern 21a; etching the transparent electrode layer 19a using a first etching process to obtain a transparent electrode pattern 19; and etching the metal layer 20a using a second etching process to obtain a first metal pattern 20b, wherein the first metal pattern 20b comprises a target metal pattern and a metal pattern to be removed;

a step S503 of removing photoresist corresponding to a top of the metal pattern to be removed using an ashing process, and removing the metal pattern to be removed using the second etching process, the residual photoresist is designated by a reference numeral 21, as shown in FIG. 6C; and a step S504 of stripping residual photoresist 21 to form the first transparent electrode layer 19, the source electrode and drain electrode line 20, and the touch control line 20, as shown in FIG. 6D.

Specifically, the first transparent electrode layer 19 is patterned to form a pixel electrode and the second transparent electrode layer 23 is patterned to form a common electrode.

Compared with the prior art, in the step S50 of the present disclosure, the positions of the pixel electrodes and the common electrodes in the array substrate are swapped so that the pixel electrodes having the pattern are disposed under the entire common electrode. Therefore, the pixel electrodes, the source and drain electrode line 20 and the touch control line 20 are prepared in a same masking process, and thus, omitting a masking process.

In the step S50 of the present disclosure, the first etching process is dry etching and the second etching process is wet etching.

Further, in order to implement that the pixel electrode, the source and drain wiring 20, and the touch control line 20 are prepared under a same masking process, the second photomask is a halftone mask.

Figure 5F:
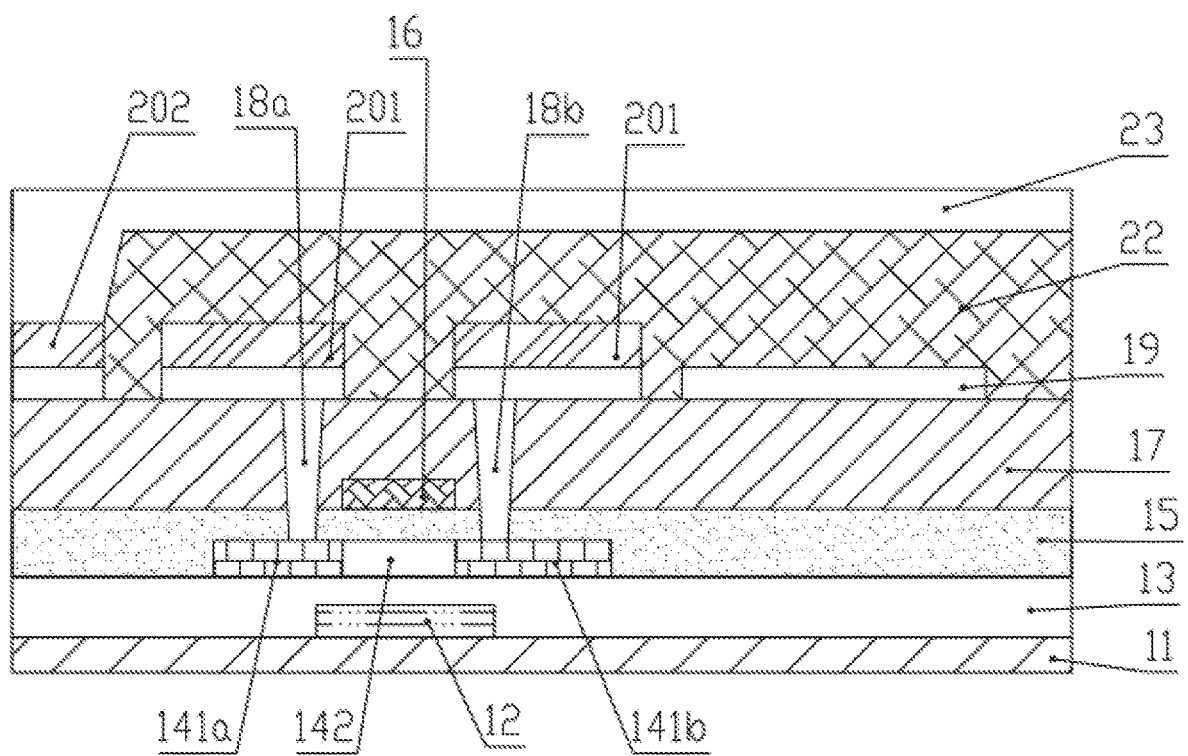

A step S60 of forming a passivation layer 22 on the source electrode and drain electrode line 20 and the touch control line 20, forming a common electrode 23 on the passivation layer, as shown in FIG. 5F.

According to another embodiment of the present invention, a manufacturing method of an array substrate is further provided which is referred to as embodiment II. The manufacturing method of the array substrate comprises:

a step S10 of providing a substrate and forming a buffer layer on the substrate;

a step S20 of forming a polysilicon layer on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer; and forming a gate insulating layer and a gate electrode, wherein the gate electrode is disposed on the gate insulating layer;

a step S30 of forming an interlayer insulating layer on the buffer layer, wherein the interlayer insulating layer covers the buffer layer, the polysilicon layer, the gate insulating layer, and the gate electrode;

a step S40 of forming a planarization layer on the interlayer insulating layer; exposing, etching, and developing the interlayer insulating layer and the planarization layer using a first photomask to define a first through hole and a second through hole, wherein the first through hole and the second through hole pass through the interlayer insulating layer and the gate insulating layer to connect with the polysilicon layer;

a step S50 of forming a transparent electrode layer and a metal layer on the interlayer insulating layer in sequence, and patterning the transparent electrode layer and the metal layer using a second photomask to form a patterned first transparent electrode layer, a source electrode and drain electrode line, and a touch control line; and a step S60 of forming a passivation layer on the source electrode and drain electrode line and the touch control line, forming a patterned second transparent electrode layer on the passivation layer.

Further, the step S50 specifically comprises:

a step S501 of depositing the transparent electrode layer and the metal layer on the planarization layer in sequence, and coating a photoresist layer on the metal layer;

a step S502 of exposing the photoresist layer using a second photomask, and then etching the photoresist layer to obtain a photoresist pattern; etching the transparent electrode layer using a first etching process to obtain a transparent electrode pattern; and etching the metal layer using a second etching process to obtain a first metal pattern, wherein the first metal pattern comprises a target metal pattern and a metal pattern to be removed;

a step S503 of removing photoresist corresponding to a top of the metal pattern to be removed using an ashing process, and removing the metal pattern to be removed using the second etching process; and a step S504 of stripping residual photoresist to form the first transparent electrode layer, the source electrode and drain electrode line, and the touch control line.

Preferably, the first etching process is dry etching and the second etching process is wet etching.

Preferably, the target metal pattern comprises the source electrode and drain electrode line and the touch control line.

The first photomask is a normal mask and the second photomask is a halftone mask.

Figure 7:
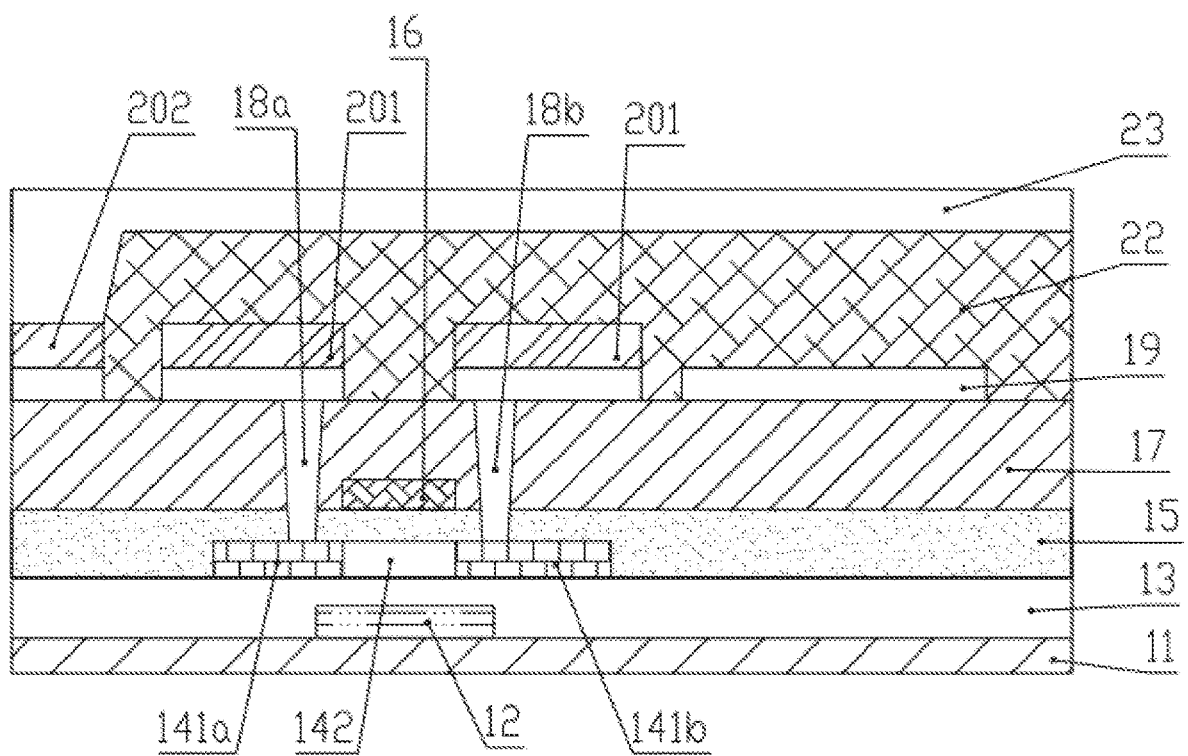
FIG. 7 is structural schematic view of an array substrate in an embodiment of the present disclosure.

According to another aspect of the present invention, an array substrate is further provided, as shown in FIG. 7. The array substrate comprises:

a substrate 11;

a metal layer 12 disposed on the substrate 11;

a buffer layer 13 disposed on the substrate 11 and covered the substrate 11;

a polysilicon layer 14 disposed on the buffer layer 13, wherein the polysilicon layer 14 comprises a source electrode doped area 141a and a drain electrode doped area 141b and a channel area 142, the source electrode doped area 141a is disposed at one end of the polysilicon layer 14 and the drain electrode doped area 141b is disposed at another end of the polysilicon layer 14, and the channel area 142 is disposed in the middle of the polysilicon layer 14;

a gate insulating layer 15 disposed on the polysilicon layer 14;

a gate electrode 16 disposed on the gate insulating layer 15;

a patterned first transparent electrode layer 19 and a patterned second electrode layer 23, wherein a passivation layer 22 is positioned between the first transparent electrode layer 19 and the second transparent electrode layer 23, the first transparent electrode layer 19 is electrically connected with the source electrode doped area and the drain electrode doped area 141, a metal layer 20 is disposed on the first transparent electrode layer 19, a source electrode and drain electrode line 201 and a touch control line 202 are disposed in the metal layer 20, the source electrode and drain electrode line 201 is electrically connected with the source electrode doped area and the drain electrode doped area 141, and the touch control line 202 is electrically connected with the second transparent electrode layer 23.

According to a preferred embodiment of the present invention, the array substrate further comprises a planarization layer (not shown), and the planarization layer is disposed on the interlayer insulating layer.

According to a preferred embodiment of the present invention, the first through hole 18a and the second through hole 18b pass through the planarization layer, the interlayer insulating layer 17 and the gate insulating layer 15 in sequence to connect with the polysilicon layer 14.

Preferably, the first transparent electrode layer 19 is patterned to form a pixel electrode, and the second transparent electrode layer 23 is patterned to form a common electrode.

The working principle of the above array substrate is the same as the principle of the manufacturing method of the array substrate. For the principle of the array substrate, please refer to the principle of the manufacturing method of the array substrate, and details are not described herein.

An array substrate and a manufacturing method thereof are provided by the present disclosure. The planarization layer and interlayer insulating layer are prepared by sharing one masking process, and the positions of a pixel electrode and a common electrode are swapped so that a source and drain electrode, a pixel electrode, and a touch control line are prepared by sharing one masking process. There is therefore providing a seven-step masking processes technology for forming an in-cell touch structure and thus, shortening the manufacturing cycle and saving the manufacturing cost.

In summary, although the present disclosure has been described with preferred embodiments thereof, the above preferred embodiments is not used to limit the present invention. One of ordinarily skill in the art can carry out changes and modifications to the described embodiment without departing from the scope and the spirit of the invention that is intended to be limited only by the appended claims.

The invention claimed is:

1. A manufacturing method of an array substrate, comprising steps of:
   a step S10 of providing a substrate and forming a buffer layer on the substrate;
   a step S20 of forming a polysilicon layer on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer; and forming a gate insulating layer and a gate electrode, wherein the gate electrode is disposed on the gate insulating layer;
   a step S30 of forming an interlayer insulating layer on the buffer layer, wherein the interlayer insulating layer covers the buffer layer, the polysilicon layer, the gate insulating layer, and the gate electrode;
   a step S40 of forming a planarization layer on the interlayer insulating layer; exposing, etching, and developing the interlayer insulating layer and the planarization layer using a first photomask to define a first through hole and a second through hole, wherein the first through hole and the second through hole pass through the interlayer insulating layer and the gate insulating layer to connect with the polysilicon layer;

a step S50 of forming a transparent electrode layer and a metal layer on the interlayer insulating layer in sequence, and patterning the transparent electrode layer and the metal layer using a second photomask to form a patterned first transparent electrode layer, a source electrode and drain electrode line, and a touch control line, wherein the step S50 specifically comprises:

a step S501 of depositing the transparent electrode layer and the metal layer on the interlayer insulating layer in sequence, and coating a photoresist layer on the metal layer;

a step S502 of exposing the photoresist layer using a second photomask, and then etching the photoresist layer to obtain a photoresist pattern; etching the transparent electrode layer using a first etching process to obtain a transparent electrode pattern;

and etching the metal layer using a second etching process to obtain a first metal pattern, wherein the first metal pattern comprises a target metal pattern and a metal pattern to be removed;

a step S503 of removing photoresist corresponding to a top of the metal pattern to be removed using an ashing process, and removing the metal pattern to be removed using the second etching process; and a step S504 of stripping residual photoresist to form the first transparent electrode layer, the source electrode and drain electrode line, and the touch control line; and a step S60 of forming a passivation layer on the source electrode and drain electrode line and the touch control line, forming a patterned second transparent electrode layer on the passivation layer, wherein the touch control line is electrically connected with the second transparent electrode layer.

2. The manufacturing method of the array substrate according to claim 1, wherein the first etching process is dry etching and the second etching process is wet etching.

3. The manufacturing method of the array substrate according to claim 1, wherein the target metal pattern comprises the source electrode and drain electrode line and the touch control line.

4. The manufacturing method of the array substrate according to claim 1, wherein the step S40 specifically comprises steps of: forming the planarization layer on the interlayer insulating layer; exposing, etching, and developing the interlayer insulating layer and the planarization layer using the first photomask to define the first through hole and the second through hole; and then etching the residual pattern of the planarization layer, wherein the planarization layer is used as the photoresist layer of the interlayer insulating layer, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

5. The manufacturing method of the array substrate according to claim 1, wherein the step S40 specifically comprises steps of: forming the planarization layer on the interlayer insulating layer; coating the photoresist layer on the planarization layer; exposing, etching, and developing the interlayer insulating layer and the planarization layer using the first photomask to define the first through hole and the second through hole; and then etching the residual pattern of the photoresist layer, wherein the planarization layer and the interlayer insulating layer share a common masking process, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

6. A manufacturing method of an array substrate, comprising:

a step S10 of providing a substrate and forming a buffer layer on the substrate;

a step S20 of forming a polysilicon layer on the buffer layer, wherein the polysilicon layer comprises a source electrode doped area and a drain electrode doped area and a channel area, the source electrode doped area is disposed at one end of the polysilicon layer, the drain electrode doped area is disposed at another end of the polysilicon layer, and the channel area is disposed in a middle of the polysilicon layer; and forming a gate insulating layer and a gate electrode, wherein the gate electrode is disposed on the gate insulating layer;

a step S30 of forming an interlayer insulating layer on the buffer layer, wherein the interlayer insulating layer covers the buffer layer, the polysilicon layer, the gate insulating layer, and the gate electrode;

a step S40 of forming a planarization layer on the interlayer insulating layer; exposing, etching, and developing the interlayer insulating layer and the planarization layer using a first photomask to define a first through hole and a second through hole, wherein the first through hole and the second through hole pass through the interlayer insulating layer and the gate insulating layer to connect with the polysilicon layer;

a step S50 of forming a transparent electrode layer and a metal layer on the interlayer insulating layer in sequence, and patterning the transparent electrode layer and the metal layer using a second photomask to form a patterned first transparent electrode layer, a source electrode and drain electrode line, and a touch control line, wherein the step S50 specifically comprises:

a step S501 of depositing the transparent electrode layer and the metal layer on the interlayer insulating layer in sequence, and coating a photoresist layer on the metal layer;

a step S502 of exposing the photoresist layer using a second photomask, and then etching the photoresist layer to obtain a photoresist pattern; etching the transparent electrode layer using a first etching process to obtain a transparent electrode pattern;

and etching the metal layer using a second etching process to obtain a first metal pattern, wherein the first metal pattern comprises a target metal pattern and a metal pattern to be removed;

a step S503 of removing photoresist corresponding to a top of the metal pattern to be removed using an ashing process, and removing the metal pattern to be removed using the second etching process; and a step S504 of stripping residual photoresist to form the first transparent electrode layer, the source electrode and drain electrode line, and the touch control line; and a step S60 of forming a passivation layer on the source electrode and drain electrode line and the touch control line, forming a patterned second transparent electrode layer on the passivation layer, wherein the touch control line is electrically connected with the second transparent electrode layer;

wherein the first photomask is a normal mask, the second photomask is a halftone mask, the first transparent electrode layer is patterned to form a pixel electrode, and the second transparent electrode layer is patterned to form a common electrode.

7. The manufacturing method of the array substrate according to claim 6, wherein the first etching process is dry etching and the second etching process is wet etching.

8. The manufacturing method of the array substrate according to claim 6, wherein the target metal pattern comprises the source electrode and drain electrode line and the touch control line.

9. The manufacturing method of the array substrate according to claim 6, wherein the step S40 specifically comprises steps of: forming the planarization layer on the interlayer insulating layer; exposing, etching, and developing the interlayer insulating layer and the planarization layer using the first photomask to define the first through hole and the second through hole; and then etching the residual pattern of the planarization layer, wherein the planarization layer is used as the photoresist layer of the interlayer insulating layer, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

10. The manufacturing method of the array substrate according to claim 6, wherein the step S40 specifically comprises steps of: forming the planarization layer on the interlayer insulating layer; coating the photoresist layer on the planarization layer; exposing, etching, and developing the interlayer insulating layer and the planarization layer using the first photomask to define the first through hole and the second through hole; and then etching the residual pattern of the photoresist layer, wherein the planarization layer and the interlayer insulating layer share a common masking process, the first through hole and the second through hole pass through the interlayer insulating layer and the gate insulating layer in sequence to connect with the polysilicon layer, the first through hole is connected with the source electrode doped area, and the second through hole is connected with the drain electrode doped area.

* * * * *

UNITED STATES PATENT AND TRADEMARK OFFICE
CERTIFICATE OF CORRECTION

PATENT NO. : 10,896,921 B2  
APPLICATION NO. : 16/086041  
DATED : January 19, 2021  
INVENTOR(S) : Guanghui Liu et al.

Page 1 of 1

It is certified that error appears in the above-identified patent and that said Letters Patent is hereby corrected as shown below:

On the Title Page

Insert the following:
Item (30) Foreign Application Priority Data
-- Apr. 28, 2018 (CN) ..................... 201810402934.6 --

Signed and Sealed this  
Eighteenth Day of May, 2021

Drew Hirshfeld  
*Performing the Functions and Duties of the  
Under Secretary of Commerce for Intellectual Property and  
Director of the United States Patent and Trademark Office*